US009136624B1

United States Patent
Reynov et al.

(10) Patent No.: US 9,136,624 B1
(45) Date of Patent: Sep. 15, 2015

(54) ORTHOGONAL CROSS-CONNECTING OF PRINTED CIRCUIT BOARDS WITHOUT A MIDPLANE BOARD

(71) Applicant: Juniper Networks, Inc., Sunnyvale, CA (US)

(72) Inventors: Boris Reynov, Cupertino, CA (US); Venkata S. Raju Penmetsa, Sunnyvale, CA (US); Ben T. Nitzan, El Granada, CA (US); Jack W. Kohn, Mountain View, CA (US); Oscar Diaz-Landa, San Jose, CA (US); Shreeram Siddhaye, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 90 days.

(21) Appl. No.: 13/852,183

(22) Filed: Mar. 28, 2013

(51) Int. Cl.
| | |
|---|---|
| *H01R 12/00* | (2006.01) |
| *H01R 12/72* | (2011.01) |
| *H01R 43/20* | (2006.01) |
| *H01R 12/50* | (2011.01) |

(52) U.S. Cl.
CPC ............. *H01R 12/72* (2013.01); *H01R 23/722* (2013.01); *H01R 43/205* (2013.01)

(58) Field of Classification Search
CPC ...... H01R 9/096–9/098; H01R 23/722–23/725
USPC .................... 439/61, 65, 69, 74, 75
See application file for complete search history.

(56) References Cited

U.S. PATENT DOCUMENTS

| | | | | |
|---|---|---|---|---|
| 5,429,521 | A  * | 7/1995 | Morlion et al. | 439/108 |
| 5,827,074 | A  * | 10/1998 | Gatti | 439/61 |
| 6,163,464 | A  * | 12/2000 | Ishibashi et al. | 361/788 |
| 6,392,142 | B1 * | 5/2002 | Uzuka et al. | 174/541 |
| 6,517,375 | B2 * | 2/2003 | MacLaren et al. | 439/489 |
| 6,824,393 | B2 * | 11/2004 | Debord et al. | 439/65 |
| 6,932,617 | B2 * | 8/2005 | Debord et al. | 439/65 |
| 7,108,556 | B2 * | 9/2006 | Cohen et al. | 439/607.08 |
| 7,354,274 | B2 * | 4/2008 | Minich | 439/65 |
| 7,978,476 | B2 * | 7/2011 | Heard et al. | 361/752 |
| 8,267,699 | B2 * | 9/2012 | Li | 439/61 |
| 2002/0046878 | A1* | 4/2002 | Uzuka et al. | 174/250 |
| 2006/0073709 | A1* | 4/2006 | Reid | 439/65 |
| 2007/0184676 | A1* | 8/2007 | Minich | 439/65 |
| 2011/0013636 | A1* | 1/2011 | Rowell et al. | 370/395.1 |
| 2013/0337665 | A1* | 12/2013 | Cohen et al. | 439/65 |

* cited by examiner

*Primary Examiner* — Chandrika Prasad
(74) *Attorney, Agent, or Firm* — Cooley LLP (57) ABSTRACT

A line card of a set of line cards is configured to be coupled to a set of switch-fabric cards to collectively define at least a portion of an orthogonal cross fabric without a midplane board. The line card has an edge portion, a first side and a second side, opposite the first side. The line card includes a set of first set of connectors and a second set of connectors. The first set of connectors is disposed along the edge portion on the first side of the line card and the second set of connectors is disposed along the edge portion on the second side of the line card.

9 Claims, 10 Drawing Sheets

ORTHOGONAL CROSS-CONNECTING OF PRINTED CIRCUIT BOARDS WITHOUT A MIDPLANE BOARD

BACKGROUND

Embodiments described herein relate generally to orthogonal cross connects, and more particularly, to methods of improved placement of switch fabric cards in a chassis with orthogonal cross-connects.

Some known high bandwidth systems include a set of line cards or the like that are arranged in an orthogonal many-to-many connectivity configuration as part of a cross-connect system or a switch-fabric. In such systems, a set of connectors of a line card are operatively coupled to corresponding connectors of a switch-fabric card that is orthogonal to the line card. Such systems allow for high speed transmission and high speed switching of data units. In some instances, however, the orthogonal configuration results in relatively large line cards and/or switch-fabric cards (or a similar electronic device having a printed circuit board (PCB)) because of the square matrix formed by the array of connectors. In some instances, in an effort to reduce the size of the line cards and/or switch-fabric cards, the connectors of each line card and/or switch-fabric cards included in the cross-connect system are arranged with a relatively tight spacing. Such arrangements can lead to challenges in cooling the line cards and/or switch-fabric cards of the cross-connect system as well as providing sufficient ventilation for the removal of heated air (e.g., heated by the electronics of the line cards).

In some instances, scaling (e.g., building chassis using a different number of similar line cards and/or switch-fabric cards) of such known systems can result in compute components on each line card and/or switch-fabric cards being underutilized. For example, in some instances, the line cards and/or switch-fabric cards of a cross-connect system each can include a number of application specific integrated circuits (ASICs) that can correspond to a number of connectors included on the line card and/or switch-fabric cards. In such instances, the reduced number of connectors, as a result of the scaling, results in the ASICs of each line card and/or switch-fabric card being underutilized.

Thus, a need exists for apparatus and methods for improved placement of line cards and/or switch-fabric cards in a chassis with orthogonal cross-connects.

SUMMARY

Apparatus and methods for improved placement of cross-connect system cards in a chassis with an orthogonal cross-connect are described herein. In some embodiments, a line card of a set of line cards is configured to be coupled to a set of switch-fabric cards to collectively define at least a portion of an orthogonal cross fabric without a midplane board. The line card has an edge portion, a first side and a second side, opposite the first side. The line card includes a set of first set of connectors and a second set of connectors. The first set of connectors is disposed along the edge portion on the first side of the line card and the second set of connectors is disposed along the edge portion on the second side of the line card.

DETAILED DESCRIPTION

Embodiments for improved placement of cross-connect system cards in a chassis with an orthogonal cross-connect are described herein. In some embodiments, a line card of a set of line cards is configured to be coupled to a set of switch-fabric cards to collectively define at least a portion of an orthogonal cross fabric (e.g., an orthogonal cross-connect system) without a midplane board. The line card has an edge portion, a first side and a second side, opposite the first side. The line card includes a set of first set of connectors and a second set of connectors. The first set of connectors is disposed along the edge portion on the first side of the line card, and the second set of connectors is disposed along the edge portion on the second side of the line card.

In some embodiments, a printed circuit board (PCB) is coupled to a set of line cards, having an orientation, and a set of switch-fabric cards, having the orientation, to define a midplane for a cross-connect system. The PCB has a first side with a first set of connectors. The PCB has a second side that is opposite the first side with a second set of connectors.

In some embodiments, a method includes forming a set of connector-receiving portions in a PCB. Each connector-receiving portion from the set of connector-receiving portions has a via and a semi-blind via. A first set of connectors is coupled to a first side of the PCB. Each connector from the set of connectors includes a ground contact and a signal contact. A second set of connectors is coupled to a second side of the PCB. Each connector from the set of connectors includes a ground contact and a signal contact. The ground contact for each connector from the first set of connectors is electrically coupled to the corresponding connector from the second set of connectors through the via of the corresponding connector-receiving portion of the PCB. The signal contact for each connector from the first set of connectors is not electrically coupled to the corresponding connector from the second set of connectors through the semi-blind via of the corresponding connector-receiving portion of the PCB.

In some embodiments, a PCB has a first side, a second side, and a set of connector-receiving portions. Each connector-receiving portion has a via and a semi-blind via. The PCB includes a first set of connectors disposed on the first side of the PCB with each connector having a ground contact and a signal contact. The PCB includes a second set of connectors disposed on the second side of the PCB with each connector having a ground contact and a signal contact. Each connector from the first set of connectors is disposed opposite a unique connector from the second set of connectors. The ground contact for each connector from the first set of connectors is electrically coupled to the corresponding connector from the second set of connectors through the via of the corresponding connector-receiving portion of the PCB. The signal contact for each connector from the first set of connectors is not electrically coupled to the corresponding connector from the second set of connectors through the semi-blind via of the corresponding connector-receiving portion of the PCB.

As used in this specification, the term "parallel" generally describes a relationship between two geometric constructions (e.g., two lines, two planes, a line and a plane or the like) in which the two geometric constructions are substantially non-intersecting as they extend substantially to infinity. For example, a line is said to be parallel to another line when the lines do not intersect as they extend to infinity. Similarly, when a planar surface (i.e., a two-dimensional surface) is said to be parallel to a line, every point along the line is spaced apart from the nearest portion of the surface by a substantially equal distance. Two geometric constructions are described herein as being "parallel" or "substantially parallel" to each other when they are nominally parallel to each other, such as for example, when they are parallel to each other within a tolerance. Such tolerances can include, for example, manufacturing tolerances, measurement tolerances, or the like.

As used herein, the terms "perpendicular" and "orthogonal" generally described a relationship between two geometric constructions (e.g., two lines, two planes, a line and a plane, or the like) in which the two geometric constructions are disposed at substantially 90°. For example, a line is said to be perpendicular to another line when the lines intersect at an angle substantially equal to 90°. Similarly, when a planar surface (e.g., a two dimensional surface) is said to be orthogonal to another planar surface, the planar surfaces are disposed at substantially 90° as the planar surfaces extend to infinity.

As used herein, the term "via" refers to an electrical interconnect included in, for example, a printed circuit board (PCB). For example, in some embodiments, a first conductive layer can be placed in electrical communication with a second conductive layer by one or more vias. A via can be a through hole defined by the PCB that has a conductive portion such as an annulus or the like. The term "semi-blind via" refers to a via that doesn't extend through the thickness of the PCB. For example, a semi-blind via can be configured to extend through a first set of layers of a PCB but not a second set of layers. Moreover, a semi-blind via is differentiated from a "blind via" or a "buried via" (not discussed herein) that generally refer to a via that extends through a set of inner layers but not the outer layers of a PCB. Thus, a semi-blind via refers to a via that extends through an outer layer (e.g., a single outer layer of a PCB) and a subset of inner layers (e.g., not all the inner layers of the PCB).

As used herein, the term "data processing unit" refers to any computer, cross-connect component, electronic switch, switch-fabric, portion of a switch-fabric, router, host device, data storage device, line card or the like used to process, transmit and/or convey electrical and/or optical signals. A data processing unit can include, for example, a component included within an electronic communications network. In some embodiments, for example, a data processing unit can be a component included within or forming a portion of a core cross-connect system (e.g., a core switch-fabric) of a data center. In other embodiments, a data processing unit can be an access switch located at an edge of a data center, or a host device (e.g., a server) coupled to the access device. For example, an access switch can be located on top of a chassis containing several host devices.

As used herein, the singular forms "a," "an" and "the" include plural referents unless the context clearly dictates otherwise. Thus, for example, the term "a line card" is intended to mean a single line card or multiple line cards, "a connector" is intended to mean one or more connectors, or a combination thereof.

Figure 1:
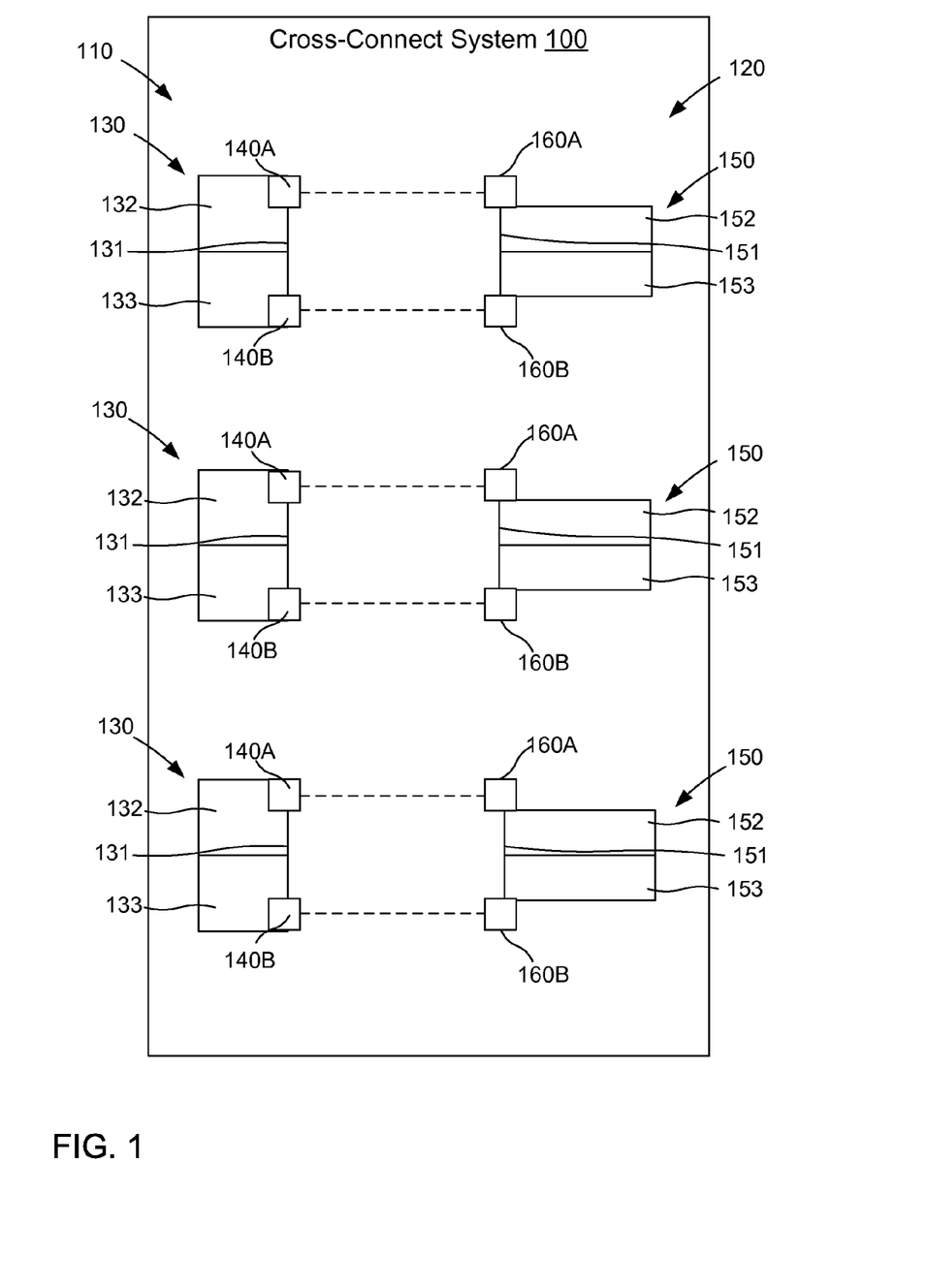
FIG. 1 is a schematic block diagram of a cross-connect system according to an embodiment.

FIG. 1 is a schematic block diagram of a cross-connect system 100 according to an embodiment. The cross-connect system 100 can include a set of devices and/or data processing units that are interconnected to route data (e.g., a data unit, a data packet, a data frame, a string of bit values and/or a payload of data) between various devices (not shown in FIG. 1). For example, the cross-connect system 100 can include any number and/or any combination of the data processing units described above. The cross-connect system 100 can be included in, for example, a data center network or the like. In such embodiments, any suitable number of data processing units (e.g., line cards or the like) can be operably coupled via any suitable set of connectors or interfaces to form the cross-connect system 100.

The cross-connect system 100 can be a cell-based fabric where one or more portions of data (e.g., data packets) are transmitted via the cross-connect system 100 in one or more cells (e.g., variable size cells, fixed size cells). In other words, an edge data processing device can provide a device, which can be configured to communicate via one protocol, with access to the cross-connect system 100, which can be configured to communicate via another protocol. The cross-connect system 100, which can be a multi-stage switch-fabric (e.g., 3-stage switch-fabric, 5-stage switch-fabric), can include multiple switch-fabrics. For example, the cross-connect system 100 can include an ingress stage, a middle stage, and an egress stage. In some embodiments, the cross-connect system 100 can be a reconfigurable (e.g., a rearrangeable) switch-fabric and/or a time-division multiplexed switch-fabric. In some embodiments, the cross-connect system 100 can be a cell-based switch-fabric configured to transmit one or more cells (e.g., fixed-size cells, variable-size cells) that can include various types of data such as portions of one or more data packets. In some embodiments, the cross-connect system 100 can be a lossless or substantially lossless switch-fabric (e.g., not based on lossy best-effort transmission protocol). In some embodiments, cross-connect system 100 can be defined based on a Clos network architecture (e.g., a strict sense non-blocking Clos network, a Benes network) and the cross-connect system 100 can include a data plane and a control plane. In this manner, the functionality of the cross-connect system 100 can be substantially related to routing and management of a data center network (not shown in FIG. 1).

As shown in FIG. 1, the cross-connect system 100 can include and/or be formed of a number of line cards 130 (collectively referred to herein as a set of line cards 110) and a number of switch-fabric cards 150 (collectively referred to herein as a set of switch-fabric cards 120). While the set of line cards 110 and the set of switch-fabric cards 120 of the cross-connect system 100 are shown in FIG. 1 as including three line cards 130 and three switch-fabric cards 150, respectively, in other embodiments, a cross-connect system can include a set of line cards having any suitable number of line cards and a set of switch-fabric cards having a corresponding number of switch-fabric cards.

Each line card 130 of the set of line cards 110 can be, for example, a printed circuit board (PCB) that can include a number of compute components (not shown in FIG. 1). For example, each line card 130 can include at least a memory and a processor to enable each line card 130 to process, transmit, route, direct, and/or otherwise convey an electrical or optical signal. In some embodiments, each line card 130 included in the set of line cards 110 can include a hardware module such as an application-specific integrated circuit (ASIC), a digital signal processor (DSP), a field programmable gate array (FPGA) and/or a software-based module (e.g., a module of computer code stored in memory and/or executed at the processor). In some embodiments, one or more of the functions associated with the line card 130 can be included in different modules and/or combined into one or more modules. In some embodiments, each line card 130 can include an external connector (not shown) that can operatively couple the cross-connect system to an external electronic device(s) (e.g., a portion of a data center or the like). Each switch-fabric card 150 of the set of switch-fabric cards 120 can be a PCB that can include a number of compute components, as described with reference to the line cards 130.

Each line card 130 of the set of line cards 110 includes an edge portion 131, a first side 132, and a second side 133. Furthermore, each line card 130 of the set of line cards 110 includes a first set of connectors 140A disposed on the first side 132 of each line card 130 and a second set of connectors 140B disposed on the second side 133 of each line card 130. Similarly each switch-fabric 150 of the set of switch-fabric cards 120 includes an edge portion 151, a first side 152, and a second side 153. Each switch-fabric card 150 of the set of switch-fabric cards 120 includes a first set of connectors 160A and a second set of connectors 160B. While the set of connectors 140A, 140B, 160A, 160B are represented in FIG. 1 by a single entity (e.g., a single box), the set of connectors 140A can include any number of connectors and the connectors 140B, 160A, and 160B can each include a corresponding number of connectors. The arrangement of the sets of connectors 140A, 140B, 160A, and 160B are described herein with respect to specific embodiments.

As shown in FIG. 1, the set of line cards 110 and the set of switch-fabric cards 120 are arranged in a substantially orthogonal configuration. In other words, each line card 130 is arranged perpendicularly to each corresponding switch-fabric card 150. For example, in some embodiments, the set of line cards 110 can be arranged in a substantially vertical direction (e.g., the edge portion 131 of each line card 130 is substantially parallel to a vertical axis) and the set of switch-fabric cards 120 can be arranged in a substantially horizontal direction (e.g., the edge portion 151 of each switch-fabric card 150 is substantially parallel to a horizontal axis). In this manner, each connector in the first set of connectors 140A of each line card 130 can align with and couple to a corresponding connector in the first set of connectors 160A of each switch-fabric card 150. Similarly, each connector in the second set of connectors 140B of each line card 130 can align with and couple to a corresponding connector in the second of connectors 160B of each switch-fabric card 150.

Figure 2:
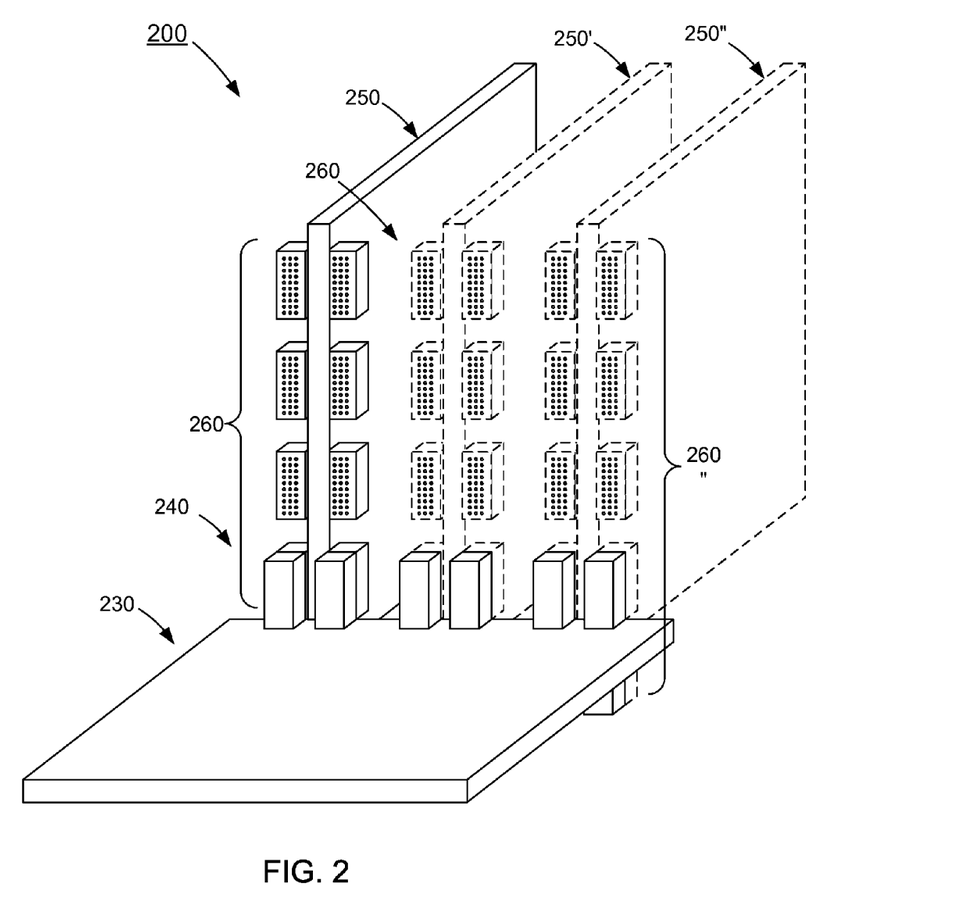
FIG. 2 is a schematic illustration of a portion of a cross-connect system according to an embodiment.

FIGS. 2-5 illustrate a cross-connect system 200 according to an embodiment. As shown in FIG. 2, a line card 230 can be disposed in a first configuration and can be coupled to one or more switch-fabric cards 250 in a second configuration. More specifically, the line card 230 and the switch-fabric card 250 can be arranged in an orthogonal configuration to form the cross-connect system 200. For example, the line card 230 can be arranged in a substantially horizontal orientation (e.g., the first configuration) and the switch-fabric card 250 can be arranged in a substantially vertical orientation (e.g., the second configuration) such that the line card 230 and the switch-fabric card 250 are substantially perpendicular. In other embodiments, a cross-connect system can include line cards and switch-fabric cards in an opposite orientation (e.g., the line card 230 is arranged in a substantially vertical orientation and the switch-fabric card 250 is arranged in a substantially horizontal orientation). Although the cross-connect system 200 is shown for simplicity in FIG. 2 as including a single line card 230 in the first configuration, the cross-connect system 200 can include a number of line cards 230 in the first configuration and a corresponding number of switch-fabric cards 250 in the second configuration (e.g., switch-fabric cards 250' and 250"). Moreover, the switch-fabric cards 250' and 250" are substantially similar to or the same as the switch-fabric card 250. Thus, a discussion of the switch-fabric card 250 applies to the switch-fabric cards 250' and 250" unless explicitly expressed otherwise.

Figure 3:
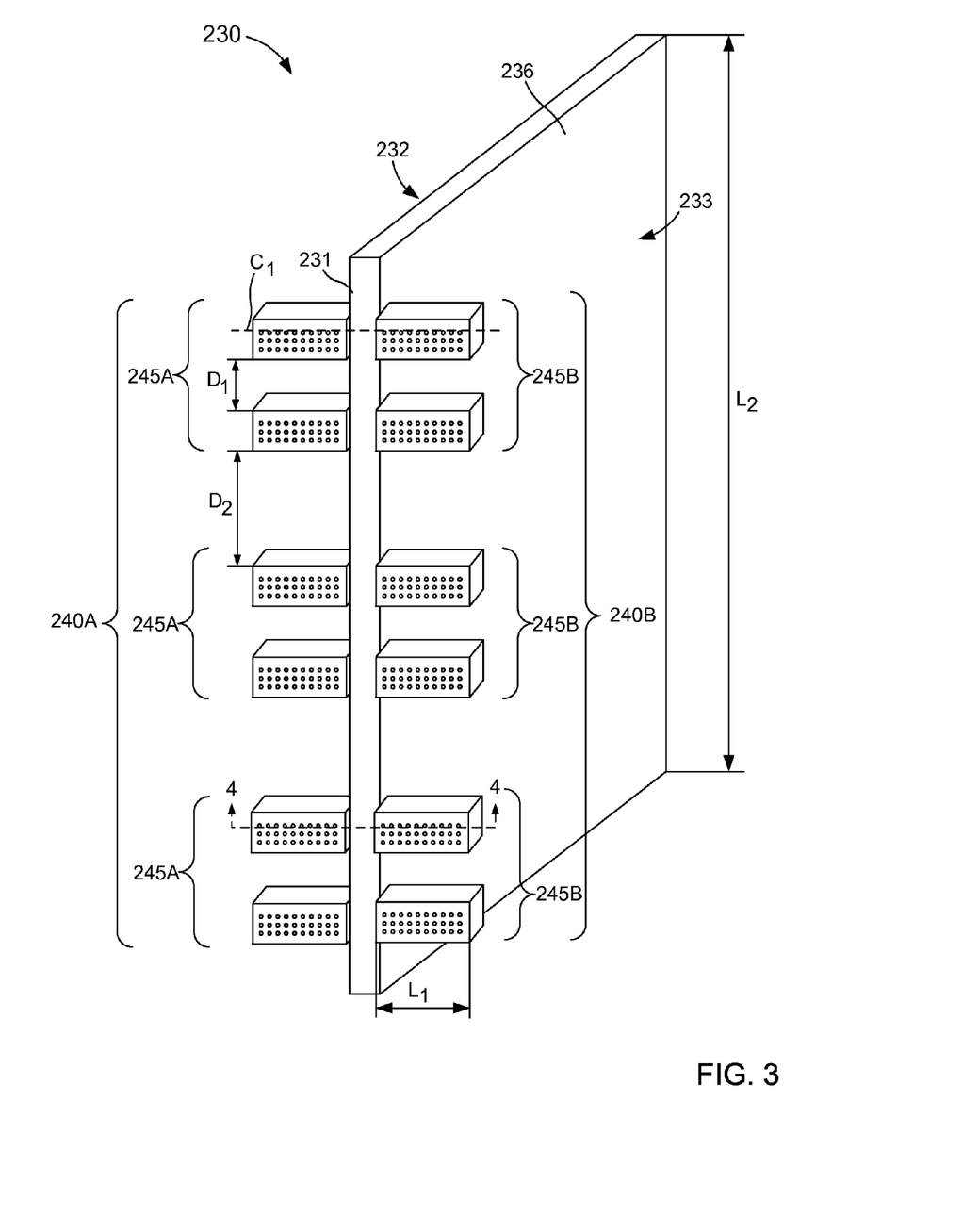
FIG. 3 is a schematic illustration of a line card included in the portion of the cross-connect system of FIG. 2.
Figure 4:
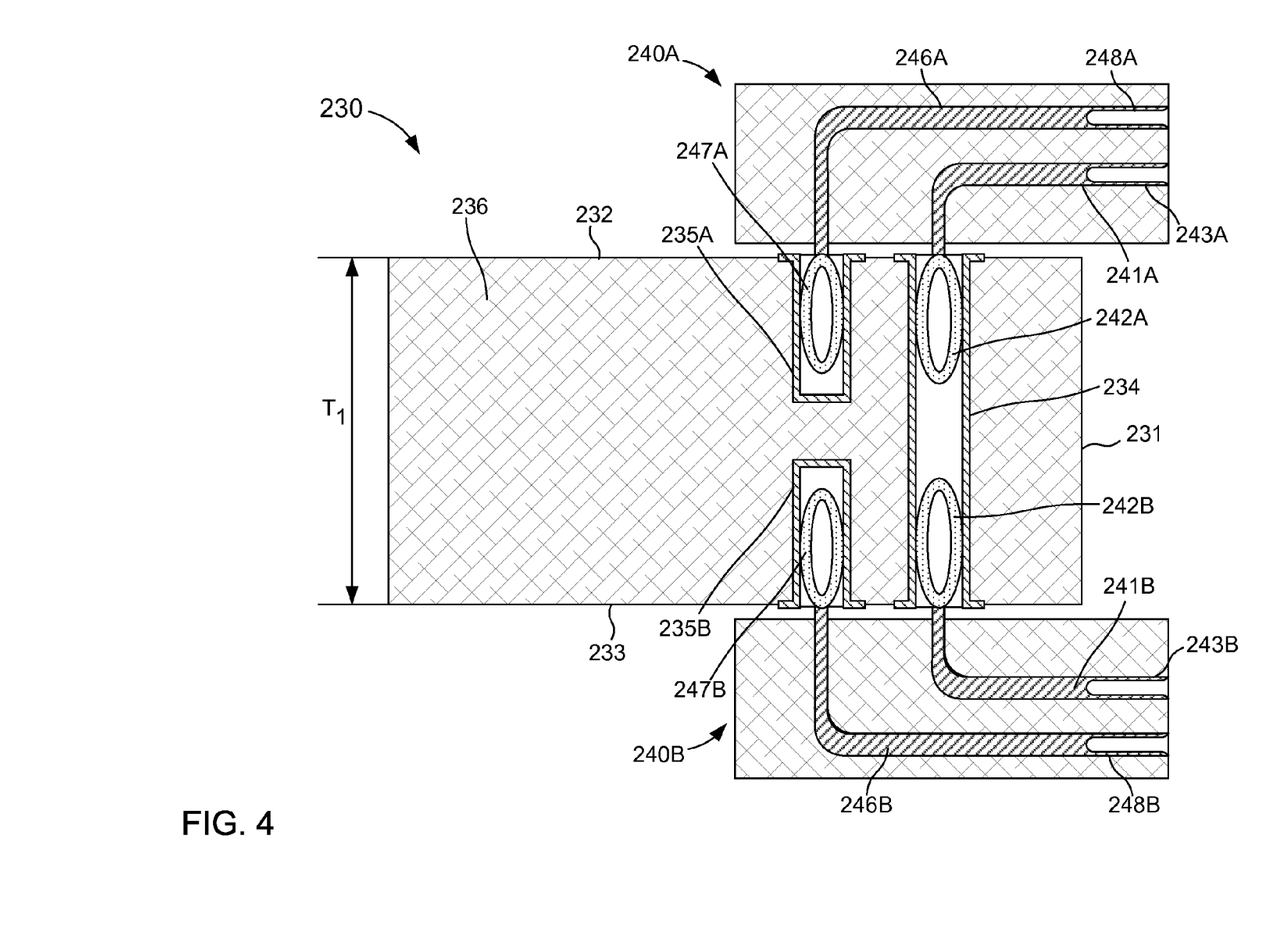
FIG. 4 is a cross-sectional illustration of the line card taken along the line 4-4 in FIG. 3, showing a ground contact and a signal contact for simplicity.
Figure 5:
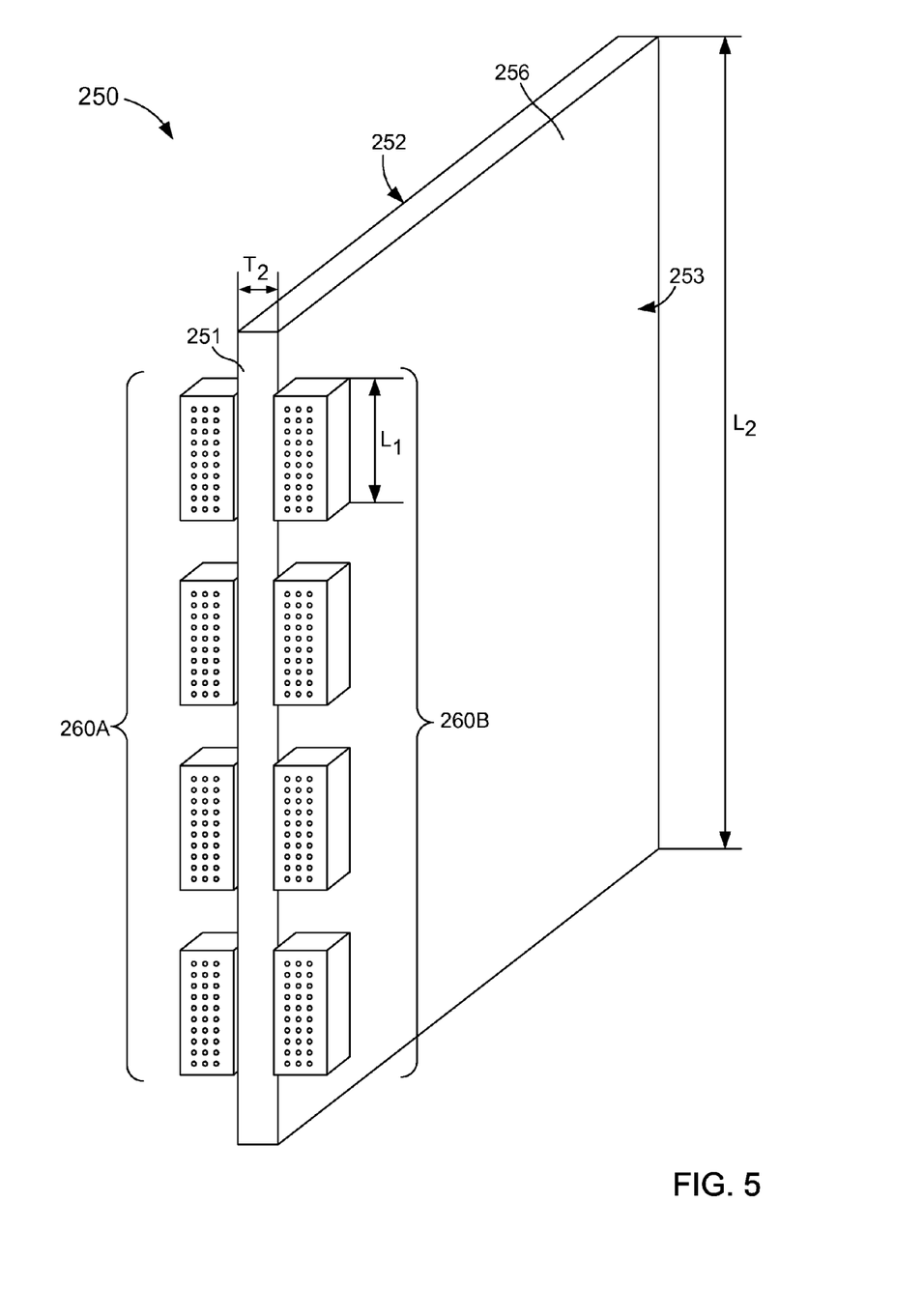
FIG. 5 is a schematic illustration of a switch-fabric card included in the cross-connect system of FIG. 2.

The line card 230 and the switch-fabric card 250 can be substantially similar in function to any of those described herein. In this manner, the line card 230 and switch-fabric card 250 can include any number of compute components (e.g., a memory and/or a processor not shown in FIGS. 2-5) that can receive, send, process, transmit, switch, route, direct, and/or otherwise convey an electrical or optical signal between the line card 230 and the switch-fabric card 250. The line card 230 includes a printed circuit board (PCB) 236 (FIG. 3) and a set of connectors 240 (FIGS. 2-4) that are physically and electrically coupled to a set of connectors 260 of the switch-fabric card 250 (FIGS. 2 and 5). As shown in FIG. 3, the PCB 236 of the line card 230 includes an edge portion 231, a first side 232, and a second side 233 that is opposite the first side 232. The line card 230 includes a first set of connectors 240A disposed along the edge portion 231 on the first side 232 of the PCB 236 and a second set of connectors 240B disposed along the edge portion 231 on the second side 233 of the PCB 236.

The connectors 240A and 240B can be disposed in any suitable arrangement relative to the PCB 236. For example, as shown in FIG. 3, the connectors 240A and 240B can extend substantially perpendicularly from the first side 232 and the second side 233, respectively, such that a connector 240A disposed on the first side 232 of the line card 230 is substantially opposite a corresponding connector 240B disposed on the second side 233 of the line card 230. Said another way, the connectors 240A and 240B can be aligned along the edge portion such that an axis $C_1$ is substantially coaxial with a longitudinal centerline (not shown in FIG. 3) of a pair of opposing connectors 240A and 240B (e.g., of the connectors 240A and 240B disposed on the top of the line card 230 in FIG. 3). Furthermore, the connectors 240A and 240B extend from the first side 232 and the second side 233, respectively, of the line card 230 such that an edge associated with a length $L_1$ of the connectors 240A and 240B is substantially perpendicular to the edge portion 231 associated with a length $L_2$ of the PCB 236. The connectors 240A and 240B are symmetrically disposed along a length of the edge portion 231. More specifically, the first set of connectors 240A can be arranged in a pair 245A such that a first distance $D_1$ is defined between the connectors 240A of the pair 245A, and a second distance $D_2$ is defined between adjacent pairs 245A. The second set of connectors 240B can be similarly arranged in pairs 240B.

The connectors 240A and 240B can be any suitable configuration. For example, as shown in FIG. 4, the connector 240A includes at least one ground contact 241A having a first end portion 242A and a second end portion 243A, and at least one signal contact 246A having a first end portion 247A and a second end portion 248A. The connector 240B includes at least one ground contact 241B having a first end portion 242B and a second end portion 243B, and at least one signal contact 246B having a first end portion 247B and a second end portion 248B. As shown in FIG. 4, the first end portion 242A of the ground contact 241A included in the connector 240A and the first end portion 242B of the ground contact 241B included in the connector 240B are disposed within a via 234 included in or defined by the PCB 236 of the line card 230. The via 234 included in the line card 230 extends through the first side 232 of the PCB 236 and the second side 233 of the PCB 236 such that the ground contact 241A of the connector 240A and the ground contact 241B of the connectors 240B are electrically coupled (e.g., by the conductive portion of the via 234) when disposed therein. More specifically, the first end portion 242A of the ground contact 241A and the first end portion 242B of the ground contact 241B can each include a press fit connector that is configured to engage the conductive portion of the via 234. In this manner, the connector 240A and the connector 240B can share a common ground.

The second end portion 243A of the ground contact 241A included in the connector 240A and the second end portion 243B of the ground contact 241B included in the connector 240B can each be arranged, for example, as a female pin connector. For example, the second end portion 243A of the ground contact 241A can be configured to receive a second end portion of a ground contact that is arranged in a male configuration. In other embodiments, the second end portion of the ground contact can be, for example, a male pin connector.

The first end portion 247A of the signal contact 246A included in the connector 240A and the first end portion 247B of the signal contact 241B included in the connector 240B are each disposed within a semi-blind via 235A and 235B, respectively. For example, as shown in FIG. 4, the semi-blind via 235A extends through the first side 232 of the PCB 236 and has a depth that is less than half of a thickness $T_1$ of the PCB 236. Similarly, the semi-blind 235B extends through the second side 233 of the PCB 236 and has a depth that is less than half of the thickness $T_1$. Thus, the first end portion 247A of the signal contact 246A disposed within the semi-blind via 235A is electrically isolated from the first end portion 247B of the signal contact 246B disposed within the semi-blind via 235B. In this manner, the signal contact 246A of the connector 240A can be associated with a first signal and the signal contact 246B of the connector 240B can be associated with a second signal that is independent of the first signal. The second end portion 248A of the signal contact 246A included in the connector 240A and the second end portion 248B of the signal contact 246B included in the connector 240B can be arranged in a similar manner as the second end portion 243A of the ground contact 241A and, thus, are not described in further detail herein. Although the connectors 240A and 240B are shown, for simplicity, in FIG. 4 as each including a single ground contact and a single signal contact, it should be understood that the connectors 240A and 240B can include any number of ground contacts and any number of signal contacts that can be arranged in a similar manner as described above.

As shown in FIG. 5, the switch-fabric card 250 includes a PCB 256 having an edge portion 251, a first side 252, and a second side 253. The switch-fabric card 250 includes a first set of connectors 260A disposed along the edge portion 251 on the first side of the PCB 256 and a second set of connectors 260B disposed along the edge portion 251 on the second side of the PCB 256. The connectors 260A and 260B can be, for example, substantially similar in form and function as the connectors 240A and 240B described above. Therefore, portions of the connectors 260A and 260B are not described in further detail herein. The connectors 260A and 260B can differ, however, by including a ground contact (not shown in FIG. 5) and a signal contact (not shown in FIG. 5) that are arranged to matingly couple to the connectors 240A and 240B. For example, in some embodiments, the second end portions 243A and 243B of the ground contacts 241A and 241B, respectively, and the second end portion 248A and 248B of the signal contacts 246A and 246B, respectively, can be arranged with a female connector (as described above) while the second end portions of the ground contacts and the signal contacts (not shown) of the connectors 260A and 260B, respectively, can be arranged with a male connector (or vice versa).

As shown in FIG. 5, the connectors 260A and 260B can extend substantially perpendicularly from the first side 252 of the PCB 256 and the second side 253 of the PCB 256, respectively, such that a connector 260A disposed on the first side 252 is substantially opposite a corresponding connector 260B disposed on the second side 253 (as described above with reference to the connectors 240A and 240B). The connectors 260A and 260B extend from the first side 252 and the second side 253, respectively, of the switch-fabric card 250 such that an edge associated with the length $L_1$ of the connectors 260A and 260B (i.e., the connectors 260A and 260B are substantially the same length $L_1$ of the connectors 240A and 240B) is substantially parallel to the edge portion 251 associated with the length $L_2$ of the PCB 256 (i.e., the PCB 256 of the switch-fabric card 250 is substantially the same length of the PCB 236 of the line card 230). The connectors 260A and 260B are symmetrically disposed along a length of the edge portion 251 of the PCB 256 of the switch-fabric card 250. More particularly, each connector 260A in the first set of connectors can be spaced at a substantially equal distance from adjacent connectors 260A. Similarly, each connector 260B in the second set of connectors can be spaced the substantially equal distance from adjacent connectors 260B.

In some embodiments, disposing the connectors 260A on the first side 252 of the switch-fabric card 250 and the connectors 260B on the second side 253 of the switch-fabric card 250 increases the number of connectors that would otherwise be included in or on the switch-fabric card 250 (e.g., some known switch-fabric cards and/or line cards include connectors on a single side). Moreover, by disposing the connectors 260A and 260B on each side (e.g., the first side 252 of the PCB 256 and the second side 250B of the PCB 256, respectively) of the switch-fabric card 250, the density of connectors for a given portion of the length $L_2$ of the PCB 256 is increased. In this manner, more connectors 260A and 260B can be disposed on the switch-fabric card 250 without increasing the length $L_2$ of the PCB 256, as described in further detail herein.

Referring back to FIGS. 3 and 5, the line card 230 in the first configuration can be coupled to the switch-fabric card 250 (and the switch-fabric cards 250' and 250") in the second configuration. The arrangement of the connectors 240A and 240B of the switch-fabric card 250 is such that a first connector 240A and a second connector 240A of a pair 245A (e.g., shown on the far left in FIG. 3) are physically and electrically coupled to a corresponding connectors 260A and 260B, respectively, of the switch-fabric card 250. Moreover, the distance $D_1$ defined between the connectors 240A included in the pair 245A can substantially correspond to a thickness $T_2$ (FIG. 5) of the PCB 256 of the switch-fabric card 250. Thus, the connectors 260A and 260B of the switch-fabric card 250 in the second configuration are substantially aligned with the connectors 240A and 240B of the line card 230A in the first configuration to define at least a portion of the cross-connect system 200.

As described above, disposing connectors 260A and 260B on each side on the switch-fabric card 250 increases the number of connectors per a unit of the length $L_2$ of the PCB 256. In some instances, the increase in the number of connectors 260A and 260B can be associated with a greater utilization of the compute components (e.g., ASICs) disposed on the switch-fabric card 250. For example, in some embodiments, a switch-fabric card (e.g., the switch-fabric card 250 shown in FIG. 5) can include an ASIC with a switching capacity to support a number of line cards equal to a number of rows of connectors multiplied by a number of connectors per row. In other words, by disposing the connectors 260A and 260B on both sides of the switch-fabric card 250, the switching capacity of the AISC can be maximized (e.g., with or near 100% utilization) with a switching capacity to support a number of line cards equal to a number of rows of connectors multiplied by a number of connectors per row. In some known cross-connect systems including the same number of rows of connectors, however, an ASIC of a switch-fabric card included in the known cross-connect system results in an underutilization of the ASIC (e.g., a 50% utilization). In other known cross-connect systems, the length of the switch-fabric card is increased to include more rows of connectors to achieve a similar utilization as the cross-connect system 200; such a longer switch-fabric card, however, may not be possible at higher operation frequencies.

In addition, the increase in the number of connectors 260A and 260B of the switch-fabric card 250 (e.g., compared to some known switch-fabric cards) is such that a fewer number of switch-fabric cards 250, 250' and 250" are included in the cross-connect system 200 to achieve a desired switch capacity. In this manner, the distance $D_2$ defined between the pairs 245A and 245B of the connectors 240A and 240B, respectively, increases the distances between the switch-fabric cards 250, 250', and/or 250" that would otherwise be defined therebetween. Thus, the increase in the distance between the switch-fabric cards 250, 250', and 250" can facilitate in a cooling of the compute components disposed on the line card 230 and/or the switch-fabric cards 250, 250' and/or 250" (e.g., via front to back cooling or the like) because a greater volume of air can pass between the line cards 230 and/or the switch-fabric cards 250, 250', and/or 250".

Figure 6:
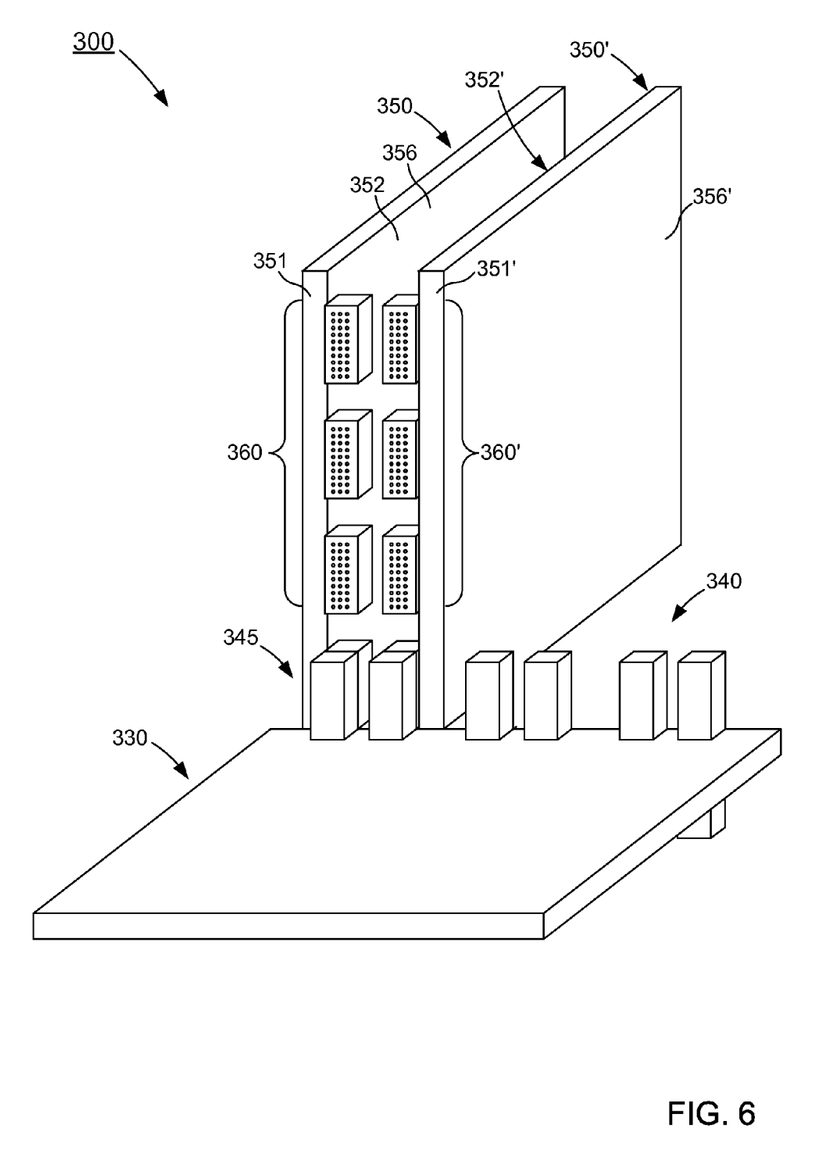
FIG. 6 is a schematic illustration of a portion of a cross-connect system in a first arrangement, according to an embodiment.

While the line card 230 in the first configuration is shown as being physically and electrically coupled to the switch-fabric card 250 having the connectors 260A and 260B disposed on the first side 252 of the PCB 256 and the second side 253 of the PCB 256, respectively, in other embodiments, the arrangement of a line card in the first configuration can provide, for example, backwards compatibility with switch-fabric cards having connectors disposed on a single side of a PCB. For example, as shown in FIG. 6, a cross-connect system 300 can include a line card 330 in the first configuration and a first switch-fabric card 350 and a second switch-fabric card 350' in a second configuration. The line card 330 can be substantially similar to or the same as the line card 230 described above with reference to FIGS. 2-4. In this manner, the line card 330 has a PCB 336 and a set of connectors 340 that can be arranged in the same arrangement as the connectors 240A and 240B of the line card 230 (see e.g., FIG. 3). For example, the set of connectors 340 can be arranged in pairs 345 in a similar manner as described above. Therefore, portions of the line card 330 are not described in further detail herein.

The switch-fabric cards 350 and 350' each have a PCB 356 and 356', respectively, that include an edge portion 351 and 351', respectively, and a side portion 352 and 352', respectively. As shown, the switch-fabric card 350 includes a set of connectors 360 that are disposed along the edge portion 351 on the side portion 352 of the PCB 356. Similarly, the switch-fabric card 350' includes a set of connectors 360' that are disposed along the edge portion 351' on the side portion 352' of the PCB 356'. In some embodiments, the arrangement of the switch-fabric card 350 and the switch-fabric card 350' can be substantially the same. In some embodiments, the switch-fabric card 350 and/or the switch-fabric card 350' can be substantially similar to known switch-fabric cards having a set of connectors disposed on a single side of the switch-fabric card and forming a portion of a cross-connect system.

As shown in FIG. 6, the switch-fabric card 350 and the switch-fabric card 350' can be disposed adjacent to one another a mirrored orientation. More specifically, the arrangement of the switch-fabric cards 350 and 350' in the cross-connect system 300 is such that both of the sets of connectors 360 and 360' are disposed between the side portions 352 of the PCB 356 and side portion 352' of the PCB 356'. The switch-fabric card 350 can be arranged, relative to the line card 330, such that one of the connectors from the set of connectors 360 is disposed opposite a first connector 340 of the pair of connectors 345. Similarly, the switch-fabric card 350' can be arranged, relative to the line card 330, such that one of the connectors from the set of connectors 360' is disposed opposite a second connector 340 of the pair of connectors 345. Although the line card 330 is shown with three pairs of connectors 345, in other embodiments, a line card in the first configuration can include any number of pairs. In this manner, a corresponding number of switch-fabric cards in the second configuration (e.g., the switch-fabric cards 350 and 350') can be physically and electrically coupled to the line card in the first configuration to for a cross-connect system.

Figure 7:
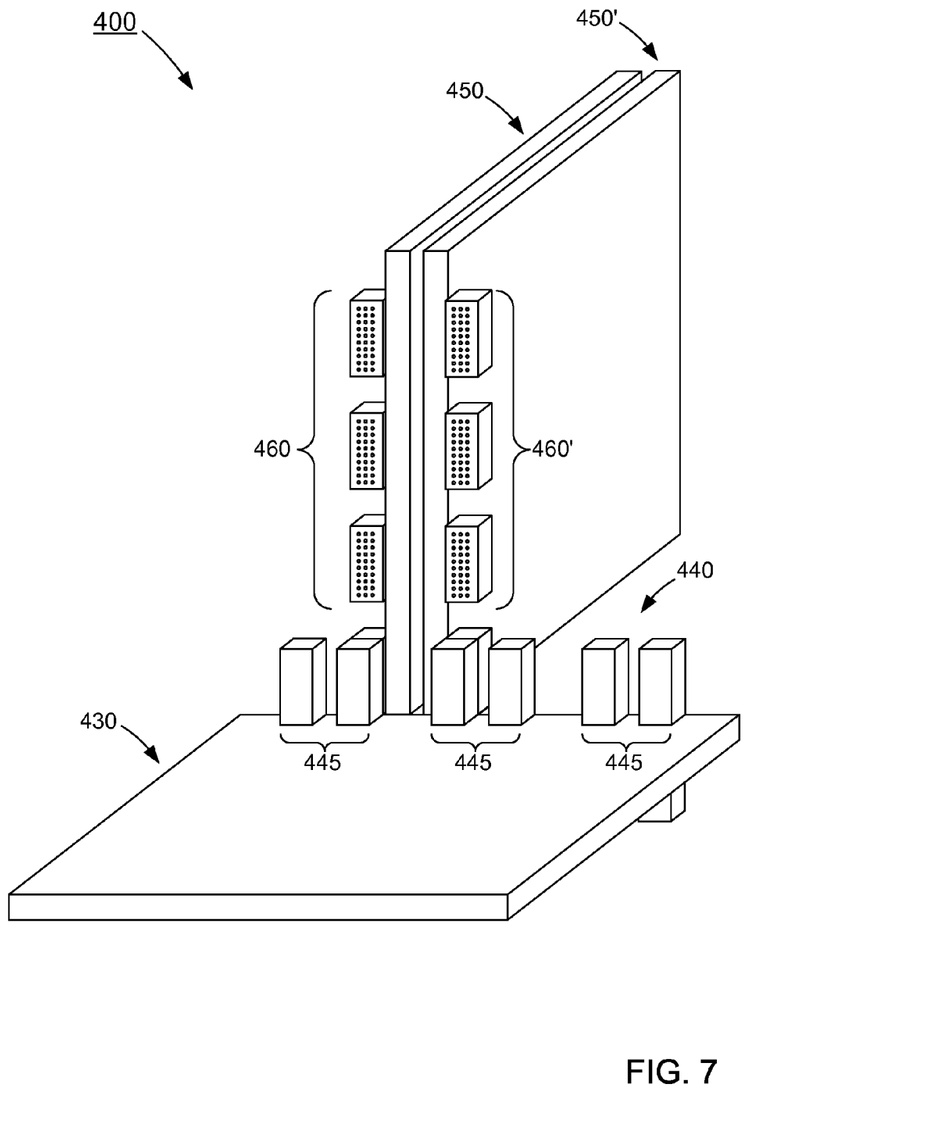
FIG. 7 is a schematic illustration of a portion of the cross-connect system of FIG. 6 in a second arrangement.

While the switch-fabric cards 350 and 350' in the second configuration are shown in a mirrored arrangement to form at least a portion of the cross-connect system 300, in other embodiments, a cross-connect system can include switch-fabric cards in the second configuration in any suitable arrangement within the cross-connect system. For example, FIG. 7 is an illustration of a cross-connect system 400 according to an embodiment. The cross-connect system 400 includes a line card 430 in a first configuration and a first switch-fabric card 450 and a second switch-fabric card 450' in a second configuration. The line card 430 can be substantially similar in form and function as the line card 230 described above with reference to FIGS. 2-4. In this manner, the line card 430 includes a set of connectors 440 that can be arranged in pairs 445, as described in detail above with reference to FIG. 3. The switch-fabric cards 450 and 450' can each be substantially similar in form and function to the switch-fabric cards 350 and 350', respectively. In this manner, the switch-fabric cards 450 and 450' each include a set of connectors 460 and 460', respectively, that are arranged in a similar manner as the connectors 360 and 360' of the switch-fabric cards 350 and 350'.

As shown in FIG. 7, the switch-fabric card 450 and the switch-fabric card 450' can be disposed adjacent to one another with each having the same orientation. The switch-fabric card 450 can be arranged, relative to the line card 430, such that one of the connectors from the set of connectors 460 is disposed opposite a first connector 440 of a first pair of connectors 445 (e.g., the right side connector 440 included in the pair of connectors 445 that are disposed on the far left of the line card 430 in FIG. 7). The switch-fabric card 450' can be arranged, relative to the line card 430, such that one of the connectors from the set of connectors 460' is disposed opposite a first connector 440 of a second pair of connectors 445. Similarly stated, the arrangement of the switch-fabric cards 450 and 450' relative to the line card 430 is such that one of the connectors of the switch-fabric card 450 is physically and electrically coupled to one of the connectors 440 of a first pair 445 and the switch-fabric card 450' is physically and electrically coupled to an adjacent connector 440 included in an adjacent pair of connectors 445, as shown in FIG. 7. Although the line card 430 is shown with three pairs of connectors 445, in other embodiments, a line card in the first configuration can include any number of pairs. In this manner, a corresponding number of switch-fabric cards in the second configuration (e.g., the switch-fabric cards 450 and 450') can be physically and electrically coupled to the line card in the first configuration to form a cross-connect system.

Although not shown in FIGS. 2-7, in some embodiments, a line card in the first configuration (e.g., the line card 230, the line card 330, and/or the line card 430) can be physically and electrically coupled to a set of switch-fabric cards in various configurations. For example, in some embodiments, a cross-connect system can be formed from one or more line cards in the first configuration that are physically and electrically coupled to one or more switch-fabric cards including connectors on a single side (e.g., the switch-fabric cards 350, 350', 450 and/or 450') and one or more switch-fabric cards including connectors on both sides (e.g., the switch-fabric card 250).

Figure 8:
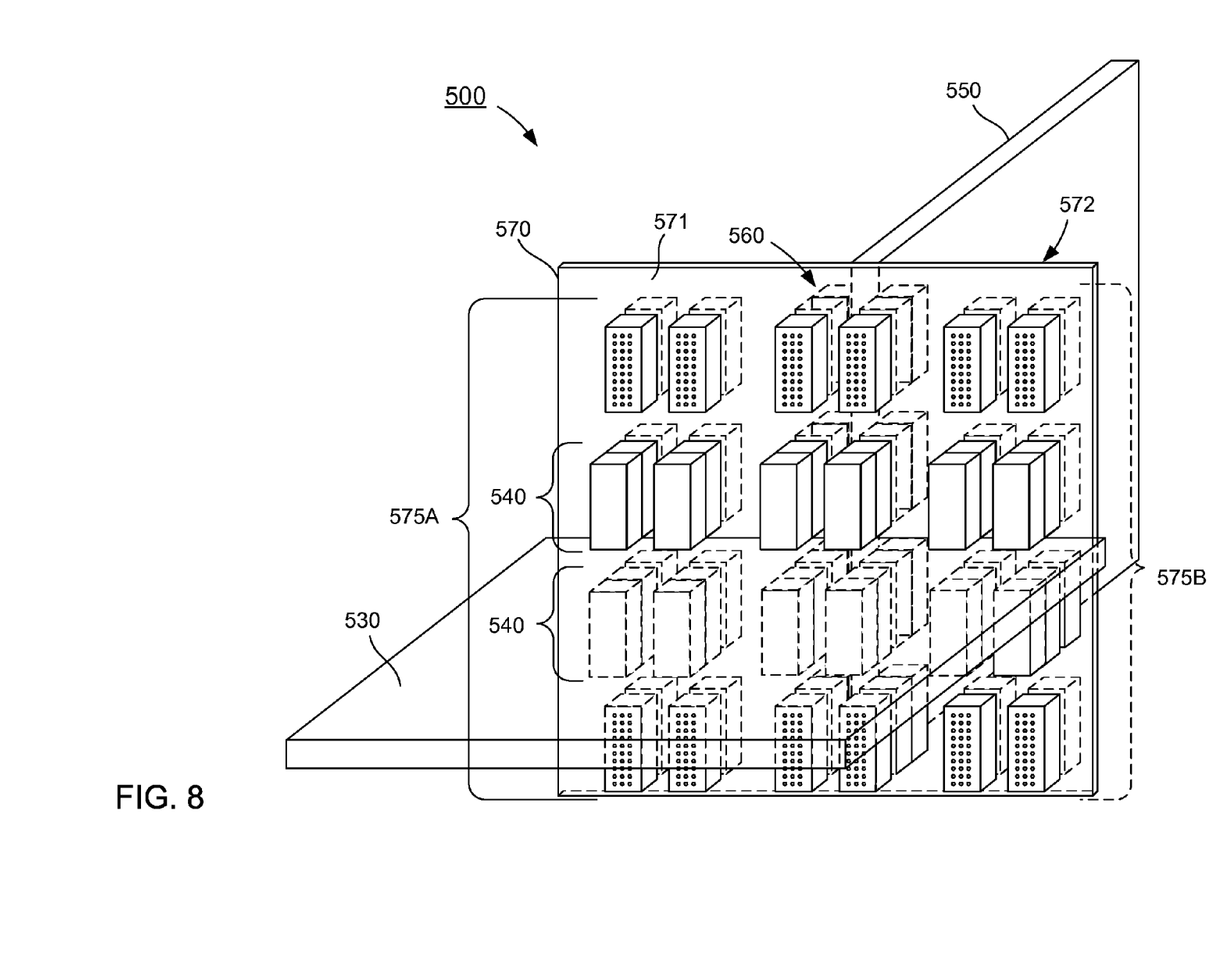
FIG. 8 is a schematic front perspective view of a portion of a cross-connect system according to an embodiment.
Figure 9:
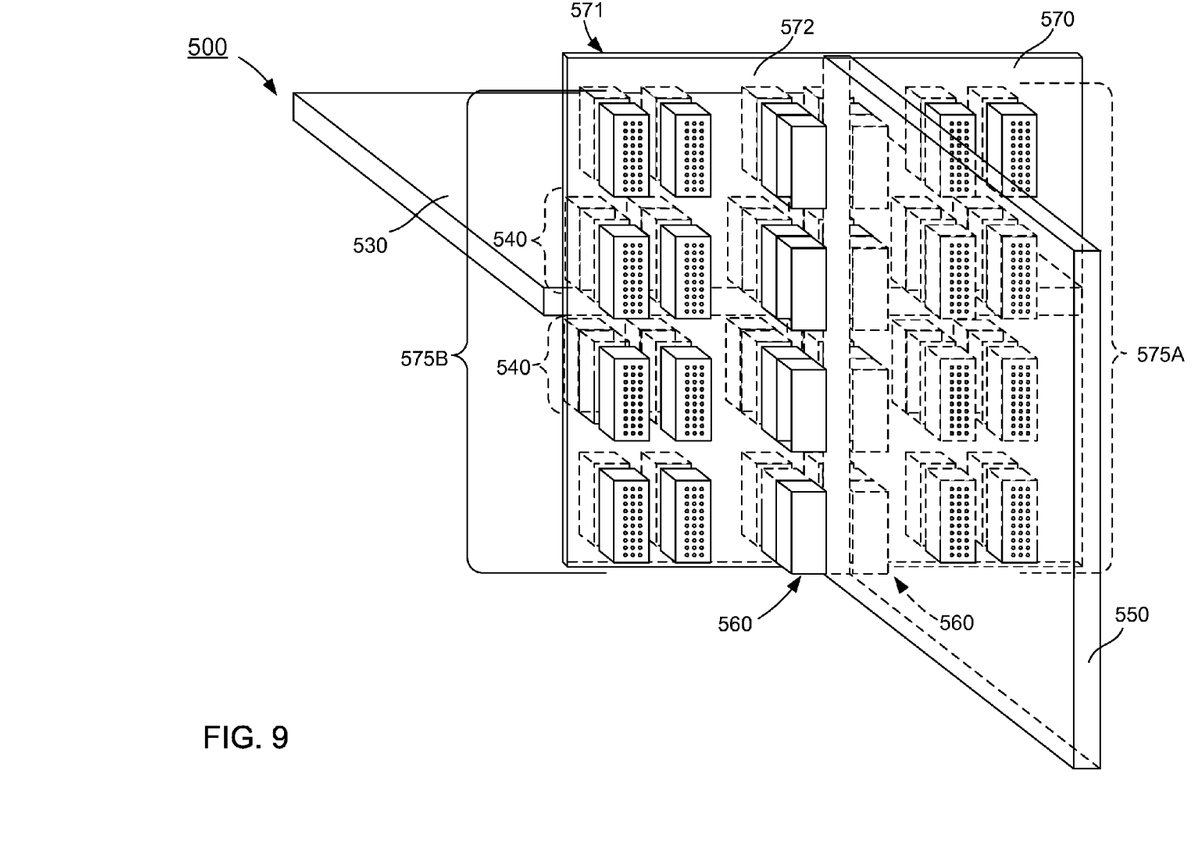
FIG. 9 is a schematic rear perspective view of the portion of the cross-connect system of FIG. 8.

Although the cross-connect systems 200, 300, and 400 have been shown and described above as being without a midplane, in some embodiments, a cross-connect system can include a midplane disposed between one or more line cards in a first configuration and one or more switch-fabric cards in a second configuration. For example, FIGS. 8 and 9 are a front perspective view and a rear perspective view, respectively, of a cross-connect system 500 according to an embodiment. The cross-connect system 500 includes a line card 530 in the first configuration, a switch-fabric card 550 in a second configuration, and a midplane 570 disposed therebetween. The line card 530 includes a set of connectors 540. The line card 530 can be substantially similar to the line card 230 described above with reference to FIGS. 2-4. The switch-fabric card 550 includes a set of connectors 560 disposed on each side of the switch-fabric card 550. The switch-fabric card 550 can be substantially similar to the switch-fabric card 250 described above with reference to FIGS. 2 and 5. Therefore, portions of the line card 530 and the switch-fabric card 550 are not described in further detail herein.

The midplane 570 has a first side 571 and a second side 572. The first side 571 of the midplane 570 includes a set of connectors 575A. The second side 572 of the midplane 570 includes a set of connectors 575B, each of which is disposed opposite a connector 575A on the first side 571. As shown in FIGS. 8 and 9, the connectors 575A and 575B can be arranged on the midplane 570 in pairs as described above with reference to the line card 230. In this manner, the midplane 570 can include an array of connectors 575A and 575B that can be substantially symmetric. Said another way, the pairs of the connectors 575A and 575B can be arranged in a matrix on the midplane 570. In some embodiments, the matrix of the pair of connectors 575A and 575B can be square (e.g., the matrix can include a set of rows formed from a number of connector pairs and a set of columns formed from the number of connector pairs).

As shown in FIGS. 8 and 9, the arrangement of the connectors 575A is such that the line card 530 in the first configuration can be physically and electrically coupled to a portion of the connectors 575A disposed on the first side 571 of the midplane 570. More specifically, the line card 530 can include a set of connectors 540 disposed on each side of the line card 530 such that when the line card 530 is coupled to the midplane 570, the connectors 540 of the line card 530 are physically and electrically coupled to a first row of connectors 575A and a second row of connectors 575B. In a similar manner, the arrangement of the connectors 575B disposed on the second side 572 of the midplane 570 is such that the switch-fabric card 550 in the second configuration can be physically and electrically coupled to a portion of the connectors 575B. As described above, the switch-fabric card 550 can include a set of connectors 560 disposed on each side of the switch-fabric card 550 such that when the switch-fabric card 550 is coupled to the midplane 570, the connectors 560 of the switch-fabric card 550 are physically and electrically coupled to a first column of connectors pairs (described above). With the line card 530 coupled to the first side 571 of the midplane 570 and with the switch-fabric card 550 coupled to the second side 572 of the midplane 570, the midplane 570 can be configured to place the line card 530 in the first configuration in electrical communication with the switch-fabric card 550 in the second configuration, via the connectors 575A and 575B such that a data unit (e.g., a data cell, data frame, data packet, string of bits, and/or data payload) can be conveyed therebetween. As described above with reference to the cross-connect system 200 of FIGS. 2-5, the arrangement of the line card 530, the midplane 570, and the switch-fabric card 550 can increase the density of the connectors 540, 575, and/or 560, respectively, disposed thereon. Thus, the line card 530 and the switch-fabric card 550 can have an overall length that can be less than an overall length that would otherwise be associated with a line card without a midplane between the line cards and the switch-fabric cards. Moreover, because of the symmetry of the cross-connect system 500, a connector surface of the midplane 570 (e.g., the surface of the midplane 570 on which the connectors 575A or 575B are disposed) can have an area that can be less than an area that would otherwise be associated with a connector surface of a midplane. In this manner, the cross-connect system 500 can accommodate, for example, components having a higher operating frequency that would otherwise be incompatible with longer switch-fabric cards and/or larger midplanes.

Figure 10:
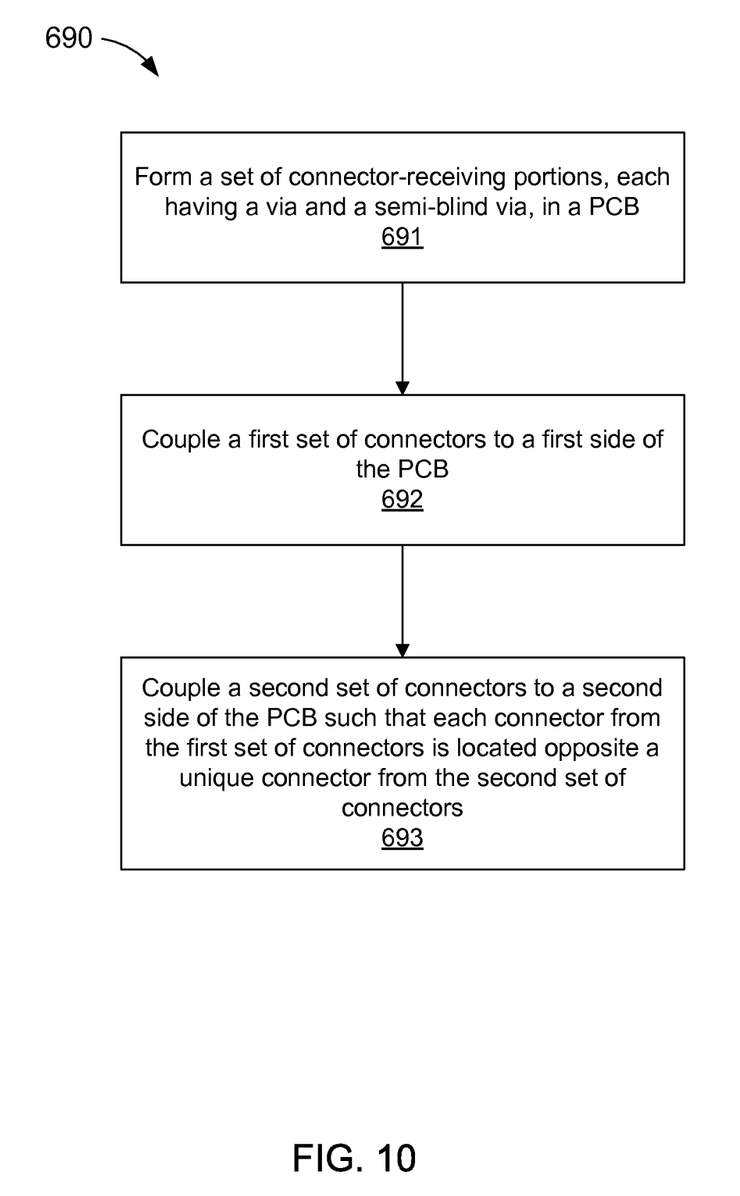
FIG. 10 is a flowchart illustrating a method of forming a portion of a printed circuit board assembly according to an embodiment.

FIG. 10 is a flowchart illustrating a method 690 for forming a printed circuit board assembly according to an embodiment. The method 690 includes forming a set of connector-receiving portions in a printed circuit board (PCB) with each set of the connector-receiving portions having a via and a semi-blind via, at 691. The connector-receiving portions can be, for example, a region of the PCB configured to be coupled to a connector. In some embodiments, each connector-receiving portion can include a number of vias and the number of semi-blind vias. For example, connector-receiving portions can include one via and one semi-blind via. In some embodiments, the connector-receiving portion can include one via and more than one semi-blind via (e.g., two, three, four, five, six, seven, eight, nine, ten, fifteen, twenty, thirty, fifty, and/or any other suitable number). In some embodiments, the via can be a through via that extends through all of the layers of the PCB. In some embodiments, the semi-blind via can extend through a portion of the layers of the PCB (e.g., less than half the layers of the PCB). The via of the receiving portion can be associated with, for example, a ground contact and the semi-blind via of the receiving portion can be associated with, for example, a signal contact. In some embodiments, the PCB can include a connector-receiving portion disposed on a first side of the PCB and a corresponding connector-receiving portion disposed on a second side of the PCB. More specifically, a connector-receiving portion of the second side of the PCB can be opposite a corresponding connector-receiving portion of the first side of the PCB. In such embodiments, the connector-receiving portion on the first side and the connector-receiving portion of the second side can include the same via. Said another way, the via of the connector-receiving portion of the first side can be the via of the corresponding connector-receiving portion of the second side (as shown, for example, in FIG. 4).

A first set of connectors are coupled to the first side of the PCB that is opposite a second side of the PCB, at 692. Each connector from the first set of connectors includes a ground contact and a signal contact. The coupling of a connector to the first side of the PCB can include disposing a portion of the ground contact of the connector within the via. More specifically, the portion of the ground contact can be electrically coupled to the via (e.g., placed in electrical communication) when the portion of the ground contact is physically disposed within the via. For example, as shown in FIG. 4, a portion of the ground contact can be placed in contact with a surface of the via to place the ground contact in electrical communication with the via. Similarly, the coupling of the connector to the first side of the PCB can include disposing a portion of the signal contact of the connector within the semi-blind via. Thus, the signal contact can be physically and electrically coupled to the semi-blind via (as described above). In this manner, the signal contact and the ground contact of each connector included in the set of connectors can be placed in electrical communication with a conductive trace on the PCB.

A second set of connectors are coupled to the second side of the PCB such that each connector included in the first set of connectors is located opposite a unique connector form the second set of connectors, at 693. Each connector from the second set of connectors includes a ground contact and a signal contact. The coupling of a connector of the second set of connectors to the second side of the PCB can include disposing a portion of the ground contact of the connector within the via. More specifically, with each connector of the second set of connectors being disposed opposite a corresponding connector of the first set of connectors, the portion of the ground contact of the connector included in the second set and the portion of the ground contact of the connector included in the first set each occupy the same via. Said another way, the ground contact for each connector from the first set of connectors is electrically coupled to the corresponding ground contact for each connector from the second set of connectors through the via. For example, as shown in FIG. 4, the ground contact 241A of the first connector 240A is electrically coupled to the ground contact 241B of the second connectors 240B through the via 234 of the line card 230.

The coupling of each connector to the second side of the PCB can include disposing a portion of the signal contact of each connector within the corresponding semi-blind via of the connector-receiving portion. Thus, the signal contact can be physically and electrically coupled to the semi-blind via (as described above). In this manner, the ground contacts of each connector disposed on the first side of the PCB are in electrical communication with the ground contacts of the corresponding connector disposed on the second side of the PCB though the via while the signal contact of each connector disposed on the first side of the PCB is electrically isolated from the signal contact of the corresponding connector disposed on the second side of the PCB through the semi-blind vias.

While various embodiments have been described above, it should be understood that they have been presented by way of example only, and not limitation. Where methods and/or schematics described above indicate certain events and/or flow patterns occurring in certain order, the ordering of certain events and/or flow patterns may be modified. While the embodiments have been particularly shown and described, it will be understood that various changes in form and details may be made. For example, although the midplane 570 is shown in FIG. 8 as having the line card 530 in the first configuration coupled to the first side 571 of the midplane 570 and the switch-fabric card 550 in the second configuration coupled to the second side 572 of the midplane 570, in other embodiments, the switch-fabric card in the second configuration can be coupled to the first side of the midplane and the line card in the first configuration can be coupled to the second side of the midplane.

Although various embodiments have been described as having particular features and/or combinations of components, other embodiments are possible having a combination of any features and/or components from any of embodiments as discussed above.

What is claimed:

1. An apparatus, comprising:
a line card configured to be included in a plurality of line cards and configured to be matingly coupled, without overlap, to a plurality of switch-fabric cards to collectively define at least a portion of an orthogonal cross fabric without a midplane board, the line card having an edge portion, a first side and a second side opposite the first side, the line card having a first plurality of connectors and a second plurality of connectors, the first plurality of connectors being disposed along the edge portion of the first side, the second plurality of connectors being disposed along the edge portion of the second side such that each connector from the first plurality of connectors is opposite a different connector from the second plurality of connectors.

2. The apparatus of claim 1, wherein:
the first plurality of connectors includes a first connector and a second connector separated by a first distance, the first plurality of connectors includes a third connector and a fourth connector separated by the first distance, the first plurality of connectors includes a fifth connector and a sixth connector separated by the first distance,
the second connector and the third connector are separated by a second distance, the fourth connector and the fifth connector are separated by the second distance, the second distance is greater than the first distance and is associated with a thickness of a switch-fabric card from the plurality of switch-fabric cards.

3. The apparatus of claim 2, wherein:
the second plurality of connectors includes a first connector and a second connector separated by the first distance, the second plurality of connectors includes a third connector and a fourth connector separated by the first distance, the second plurality of connectors includes a fifth connector and a sixth connector separated by the first distance,
the second connector of the second plurality of connectors and the third connector of the second plurality of connectors are separated by the second distance, the fourth connector of the second plurality of connectors and the fifth connector of the second plurality of connectors are separated by the second distance.

4. The apparatus of claim 1, wherein:
the first plurality of connectors includes a first connector and a second connector adjacent to the first connector, the first connector and the second connector collectively configured to be removably coupled to a first connector and a second connector of a switch-fabric card, the switch-fabric card being from the plurality of switch-fabric cards, the first connector of the switch-fabric card being on a first side of the switch-fabric card, the second connector of the switch-fabric card being on a second side of the switch-fabric card opposite of the first side of the switch-fabric card.

5. The apparatus of claim 1, wherein:

the first plurality of connectors includes a first connector and a second connector adjacent to the first connector, the first connector configured to be removably coupled to a connector of a first switch-fabric card, the second connector configured to be removably coupled to a connector of a second switch-fabric card, the first switch-fabric card and the second switch-fabric card are each from the plurality of switch-fabric cards, the first switch-fabric card having an upper side and a lower side opposite the upper side of the first switch-fabric card, the second switch-fabric card having an upper side and a lower side opposite the upper side of the second switch-fabric card, the connector of the first switch-fabric card being on the lower side of the first switch-fabric card, the connector of the second switch-fabric card being on the upper side of the second switch-fabric card.

6. The apparatus of claim 1, wherein:

each connector from the first plurality of connectors includes a ground contact and a signal contact, each connector from the second plurality of connectors includes a ground contact and a signal contact, the ground contact for each connector from the first plurality of connectors is electrically coupled to the corresponding connector from the second plurality of connectors through a via, the signal contact for each connector from the first plurality of connectors is not electrically coupled to the corresponding connector from the second plurality of connectors through a semi-blind via.

7. An apparatus, comprising:

a printed circuit board (PCB) configured to be matingly coupled to a plurality of PCBs to collectively define at least a portion of an orthogonal cross fabric without a midplane board, an outermost surface of the PCB configured to substantially abut an associated outermost surface of each PCB from the plurality of PCBs when coupled thereto, the PCB having a first side and a second side opposite the first side, the PCB having a plurality of connector-receiving portions, each connector-receiving portion from the plurality of connector-receiving portions having a via and a semi-blind via, the PCB having a first plurality of connectors and a second plurality of connectors, each connector from the first plurality of connectors being disposed on the first side and including a ground contact and a signal contact, each connector from the second plurality of connectors being disposed on the second side and including a ground contact and a signal contact, each connector from the first plurality of connectors being located opposite a different connector from the second plurality of connectors, the ground contact for each connector from the first plurality of connectors being electrically coupled to the corresponding connector from the second plurality of connectors through the via for the corresponding connector-receiving portion from the plurality of connector-receiving portions, the signal contact for each connector from the first plurality of connectors not being electrically coupled to the corresponding connector from the second plurality of connectors through the semi-blind via for the corresponding connector-receiving portion from the plurality of connector-receiving portions.

8. The apparatus of claim 7, wherein the PCB is a line card configured to be included within a plurality of line cards, the plurality of PCBs are a plurality of switch-fabrics cards, each line card from the plurality of line cards is configured to be coupled to the plurality of switch-fabric cards to define the orthogonal cross fabric without the midplane card, the line card has an edge portion, the first plurality of connectors is disposed along the edge portion on the first side, the second plurality of connectors is disposed along the edge portion on the second side.

9. The apparatus of claim 7, wherein:

the first plurality of connectors includes a first connector and a second connector separated by a first distance, the first plurality of connectors includes a third connector and a fourth connector separated by the first distance, the first plurality of connectors includes a fifth connector and a sixth connector separated by the first distance, the second connector and the third connector are separated by a second distance, the fourth connector and the fifth connector are separated by the second distance, the second distance is greater than the first distance and is associated with a thickness of a PCB from the plurality of PCBs.

\* \* \* \* \*